United States Patent [19]

Ludden et al.

[11] Patent Number: 5,637,925

[45] Date of Patent: Jun. 10, 1997

[54] USES OF UNIAXIALLY ELECTRICALLY CONDUCTIVE ARTICLES

[76] Inventors: Michael J. Ludden, 12 Casson Rd., Swindon, Wiltshire; Nicholas J. G. Smith, 11 N. Meadow Rd., Cricklade, Wiltshire SN6 6LT; Paul J. Gibney, 7 Hathersage Moor, Liden, Swindon, Wiltshire SN3 6NW; Peter Nyholm, 165 Okus Rd., Swindon, Wiltshire, SN1 4JY, all of England

[21] Appl. No.: 7,389

[22] Filed: Jan. 21, 1993

Related U.S. Application Data

[63] Continuation of Ser. No. 548,964, filed as PCT/GB89/00110, Feb. 3, 1989 published as WO89/07338, Aug. 10, 1989 abandoned.

[30] Foreign Application Priority Data

| Feb. 5, 1988 | [GB] | United Kingdom | 8802565 |
|---|---|---|---|
| Feb. 5, 1988 | [GB] | United Kingdom | 8802567 |
| Jun. 29, 1988 | [GB] | United Kingdom | 8815447 |
| Sep. 30, 1988 | [GB] | United Kingdom | 8823053 |
| Dec. 2, 1988 | [GB] | United Kingdom | 8828245 |
| Feb. 3, 1989 | [WO] | WIPO | PCT/GB89/00110 |

[51] Int. Cl.$^6$ .................................. H01L 23/48
[52] U.S. Cl. ........................ 257/774; 257/786
[58] Field of Search ............... 357/65, 67, 71, 357/68; 257/671, 786, 774, 778

[56] References Cited

U.S. PATENT DOCUMENTS

| 3,373,481 | 3/1968 | Lins et al. ........................ 29/471.3 |
|---|---|---|
| 3,560,257 | 2/1971 | Schneble et al. .................. 257/774 |
| 3,585,712 | 6/1971 | Boncuk ............................... 357/65 |
| 3,633,269 | 1/1972 | Bachmeier ........................ 357/65 |
| 3,665,590 | 5/1972 | Percival ............................ 357/65 |
| 3,698,076 | 10/1972 | Kingsely ............................ 357/65 |
| 3,758,705 | 9/1973 | Owen-Illinois Inc. .......... 174/113 R |
| 3,871,014 | 3/1975 | King et al. ........................ 357/65 |
| 3,871,015 | 3/1975 | Lin et al. ........................... 357/65 |
| 4,252,990 | 2/1981 | Shin-Eisu Polymer Co. ..... 174/52 R |
| 4,268,956 | 5/1981 | Parks et al. ....................... 29/869 |
| 4,336,551 | 6/1982 | Fujita et al. ...................... 357/65 |
| 4,451,842 | 5/1984 | Pommerrenig .................... 357/65 |
| 4,499,655 | 2/1985 | Anthony ............................ 257/774 |
| 4,649,338 | 3/1987 | General Dynamics ......... 324/158 P |
| 4,667,219 | 5/1987 | Trilogy Computers ........... 357/68 |
| 4,703,559 | 11/1987 | Ehrfield et al. ................... 29/854 |
| 4,926,241 | 5/1990 | Carey ................................. 257/786 |
| 5,061,989 | 10/1991 | Yen et al. .......................... 357/65 |
| 5,136,359 | 8/1992 | Takayama et al. ............... 257/774 |

FOREIGN PATENT DOCUMENTS

| 0034243 | 8/1981 | European Pat. Off. . |
|---|---|---|
| 0106990 | 5/1984 | European Pat. Off. . |
| 0160236 | 6/1985 | European Pat. Off. . |
| 0160761 | 11/1985 | European Pat. Off. . |
| 0171232 | 2/1986 | European Pat. Off. . |
| 0213774 | 3/1987 | European Pat. Off. . |
| 0183598 | 6/1987 | European Pat. Off. . |
| 0213774 | 11/1987 | European Pat. Off. . |

(List continued on next page.)

OTHER PUBLICATIONS

Japanese Laid–Open Patent Publication No. 61–110441 (US equivalent 4,703,559 enclosed).
Japanese Laid–Open Patent Publication No. 61–265827.
Japanese Laid–Open Patent Publication No. 55–098839.
Japanese Laid–Open Patent Publication No. 61–194745.
IBM Technical Disclosure Bulletin, vol. 32, #1013, Mar. 1990 pp. 474–475.
"Direct Chip Bonding Using Transferred Conductive Adhesive Film".

*Primary Examiner*—Sara W. Crane

[57] ABSTRACT

The present concepts include "1:1" uniax (40) with one conductive through-hole per chip connection site, "mirror chip" testing, heat-sink bonding to chips, avoiding contact with conductive cleaved edge of chip, indium solid columns, metal recessed (41) in the through-holes. All of these are subject to preferred materials (UPILEX polyimide) and techniques (U.V. laser ablation, minimum taper of holes).

22 Claims, 11 Drawing Sheets

FOREIGN PATENT DOCUMENTS

| | | |
|---|---|---|
| 0245179 | 11/1987 | European Pat. Off. . |
| 547877 | 1/1979 | Japan ............................... 357/65 |
| 1238148 | 9/1989 | Japan ............................... 357/65 |
| 2310941 | 12/1990 | Japan ............................... 357/65 |
| 914839 | 1/1963 | United Kingdom . |
| 1262787 | 2/1972 | United Kingdom . |
| 1311659 | 3/1973 | United Kingdom . |
| 1502517 | 3/1978 | United Kingdom . |
| 1268978 | 3/1979 | United Kingdom . |
| 1545701 | 5/1979 | United Kingdom . |
| 1284481 | 8/1979 | United Kingdom . |
| 2017408 | 10/1979 | United Kingdom . |
| 1569379 | 6/1980 | United Kingdom . |
| 1587416 | 4/1981 | United Kingdom . |
| 2149980 | 6/1985 | United Kingdom . |
| 2189657 | 10/1987 | United Kingdom . |
| 1341037 | 12/1973 | WIPO . |
| 87/04316 | 7/1987 | WIPO . |

Fig. 1.
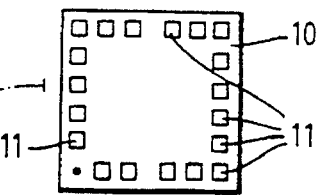
1. CHIP FACE.
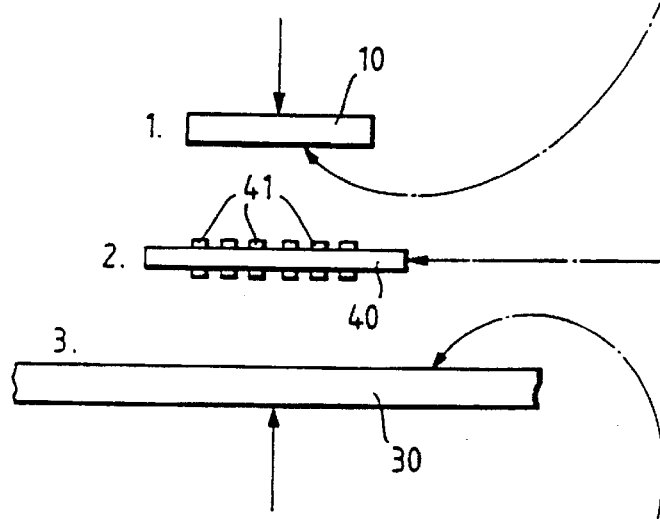
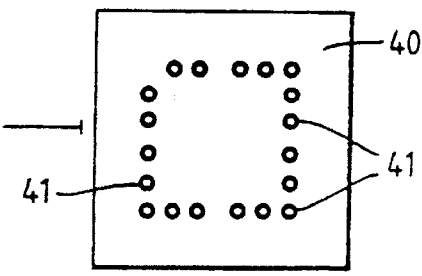
2. UNIAXIALLY CONDUCTIVE SHEET.
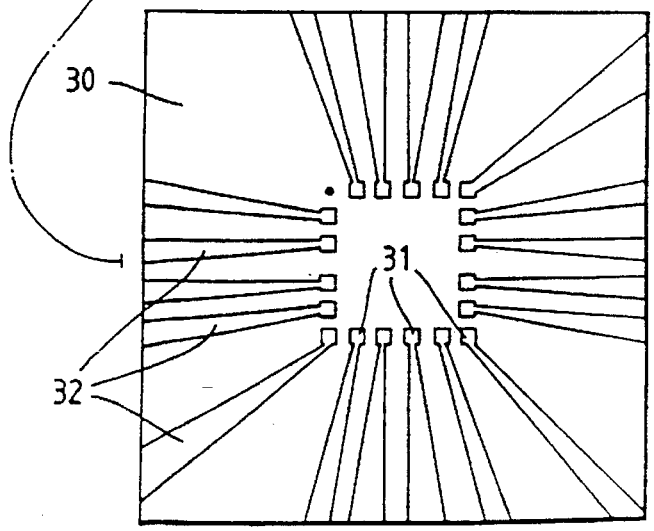
3. CIRCUIT BOARD.

Fig. 3.
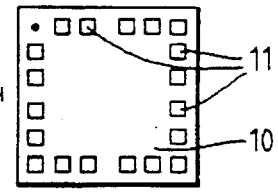
1. CHIP UNDERSIDE.
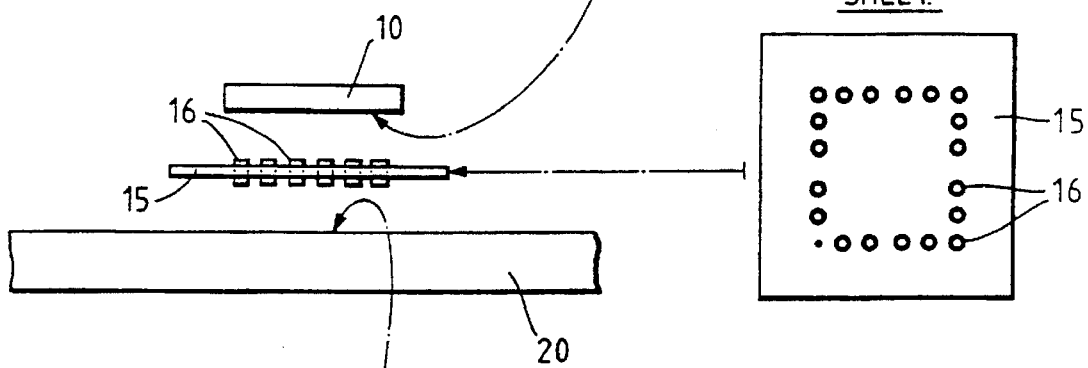
2. UNIAXIALLY CONDUCTIVE SHEET.
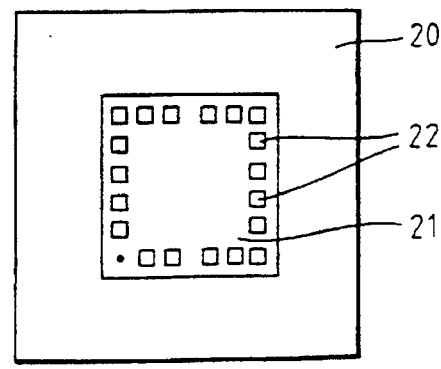
3. MIRROR CHIP.

Fig. 4.
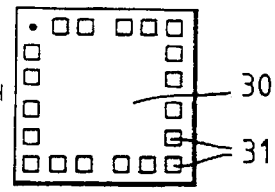
1. CHIP TOP SURFACE.
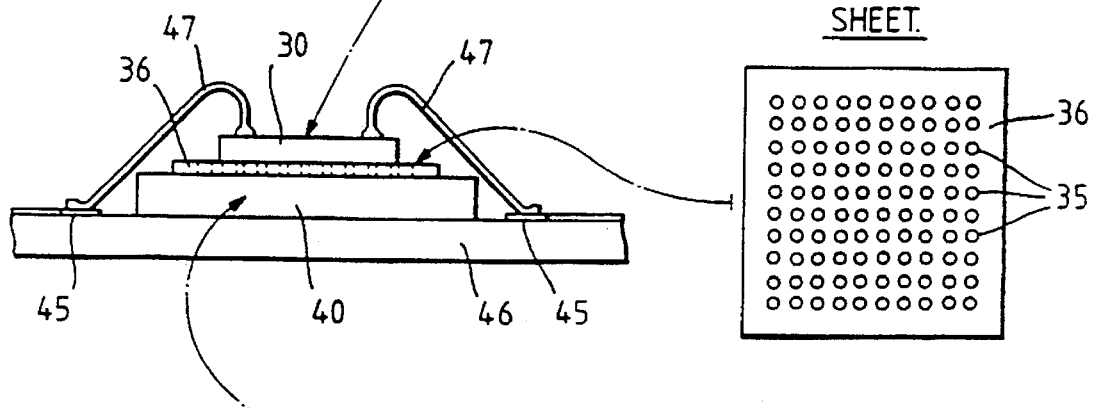
2. UNIAXIALLY CONDUCTIVE SHEET.
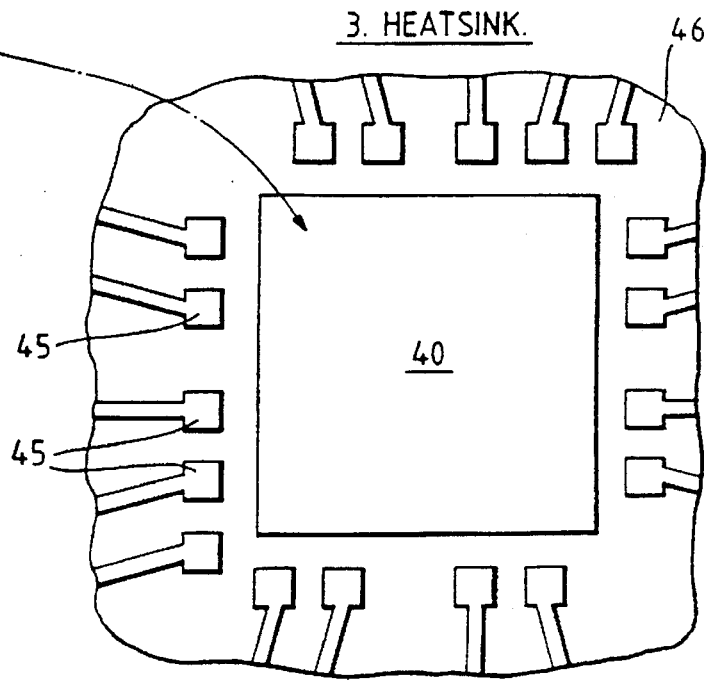
3. HEATSINK.

Fig. 5.
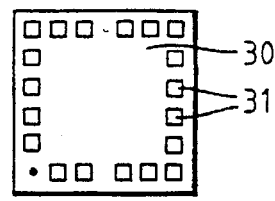
1. CHIP UNDERSIDE.
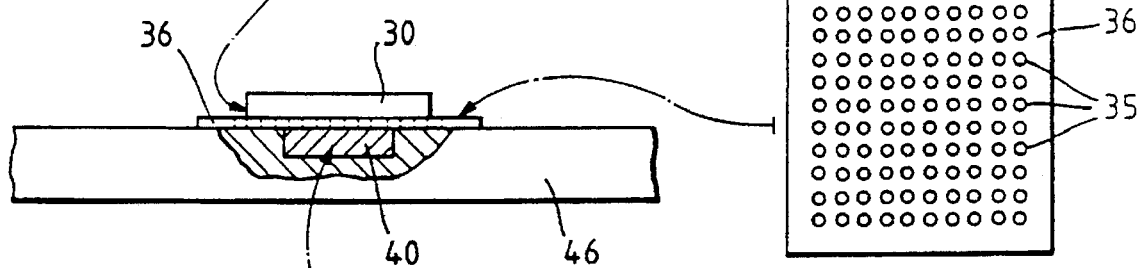
2. UNIAXIALLY CONDUCTIVE SHEET.
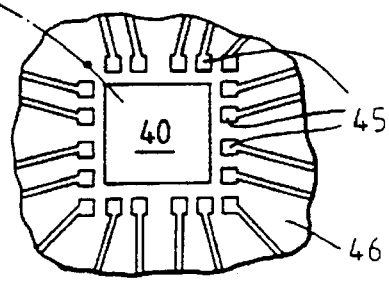
3. HEATSINK.

Fig. 8.
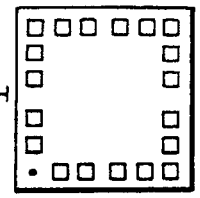
1. CHIP.
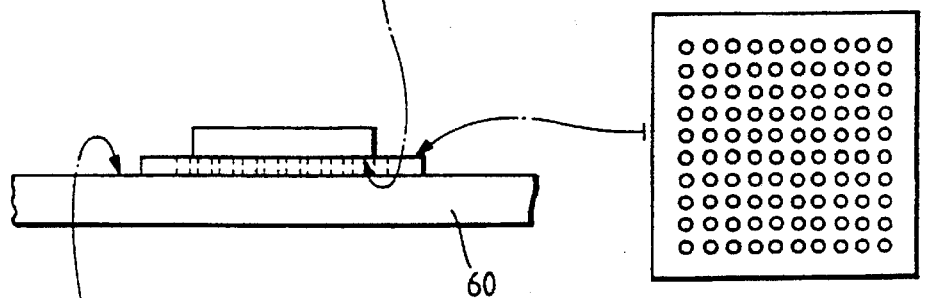
2. UNIAXIALLY CONDUCTIVE SHEET.
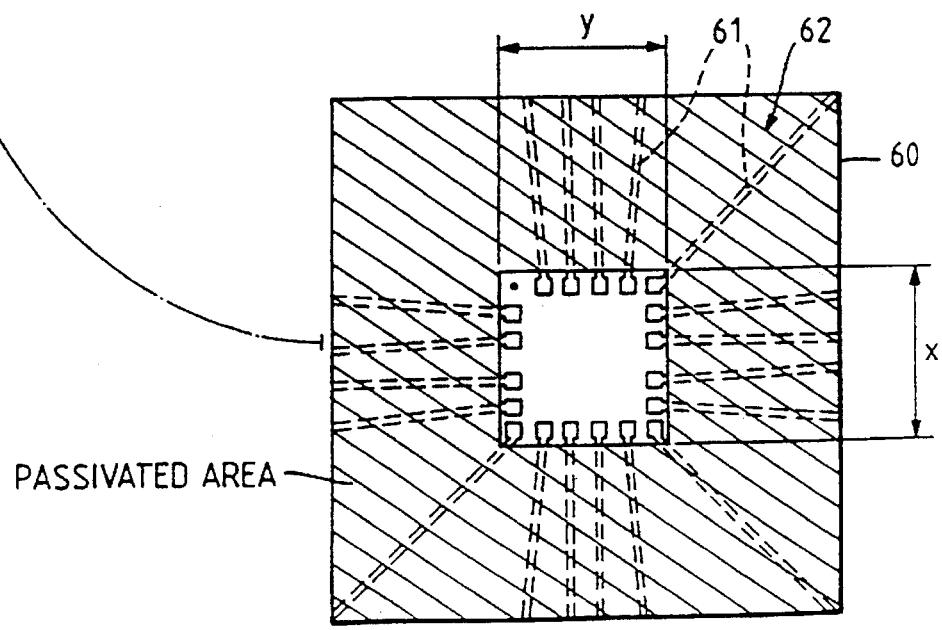
3. CIRCUIT BOARD.
PASSIVATED AREA

INDIUM COLUMNS

USES OF UNIAXIALLY ELECTRICALLY CONDUCTIVE ARTICLES

This application is a continuation of application Ser. No. 07/548,964, filed as PCT/GB89/00110, Feb. 3, 1989 published as WO89/07338, aug. 10, 1989, now abandoned.

This invention relates to new practical applications of uniaxially electrically conductive articles, and to special forms of such article for use therein.

It is known from U.S. Pat. No. 3,303,085 to produce porous mica sheets in which relatively straight-line through-holes of 5 to 20,000 Angstroms diameter, produced by heavy particle radiation followed by etching of the mica, are simply filled with superconductive material or iron particles to provide oriented single domain ferromagnetic sheet, or with material suitable for imaging in television cameras. The surfaces of the mica sheet may be polished or abraded to assure electrical contact with the conductive filler.

Porous polymer sheets in which selected areas of the interconnecting through-holes are masked and the unmasked through-holes are metal plated to provide electrically conductive spots surrounded by insulating areas, are known from Japanese Published Patent Application 80161306.

Published EP-A-0213774 describes a superior form of uniaxially electrically conductive article comprising porous electrically insulating sheet material at least a selected portion of which has at least 25 substantially non-interconnected through-holes of not more than 200 micrometres diameter per square millimetre of its surface, at least a significant proportion of which through-holes individually contain electrically conductive material which provides an electrically conductive path between, and projects beyond at least one of, the main surfaces of the sheet material, each such conductive path being electrically separate from substantially all of the other such conductive paths.

1:1 Connection

One aspect of the present invention provides a uniaxially electrically conductive article for making electrical connections to a predetermined pattern of a connection sites on a first substrate when arranged in face-to-face alignment with corresponding pattern of connection sites with a second substrate, the article comprising electrically insulating sheet material having a pattern of through-holes corresponding to the said patterns of connection sites, each of which holes is not more than 200 micrometres in diameter and is internally plated with electrically conductive path between, and projects beyond but not significantly along, the main surfaces of the sheet material to make electrical connections between facing pairs of the connection sites when the sheet material in use is arranged between the substrates with the conductive material in each of the said through-holes aligned between and in contact with its corresponding pair of connection sites.

The substrates to be connected in this and other aspects of the invention may be of any desired kind for any desired purpose, especially in the field of microelectronics, a major interest for the present invention being connection of connection sites on a semi-conductor chip, e.g. an integrated circuit chip, to associated circuitry for testing the chip, or for assembling it into an electronic device. Other advantageous uses of the present invention include making electrical connections to the back of a closely packed array of individual sensors or display pixels.

It is an advantage of this aspect of the present invention that the article is uniaxially conductive, having no electrically conductive tracks leading from the through-holes along its main surfaces. This permits direct one-to-one connection and very close spacing between the facing connection sites, thus avoiding many of the problems, such as matching impedances and design of earth planes and limited selection of materials owing to the need for low dielectric constants to minimise signal propogation and rise times and cross talk, which problems can render unduly expensive known surface-tracked connector constructions such as fan-out boards, probe cards, flexible printed circuits, or other circuit boards.

The simpler uniaxial construction of the present invention can even be treated as disposable, and can be rendered more economical by having two or more patterns of the said through-holes corresponding to the said patterns overlapping each other so that their respective through-holes are interspersed in such a way that any one of the overlapping through-hole patterns may be selected for alignment with the facing patterns of connection sites. In this form of the invention, the hole pattern in use may be changed by simply repositioning the uniaxially conductive sheet relative to the opposed patterns of connection sites.

Whether or not such overlapping patterns are used, an advantageous form of article according to the invention for use with a first substrate which is a semiconductor chip a peripheral part of whose connection-site-carrying surface comprises unpassivated or bare semiconductor material, has the pattern(s) of through-holes arranged to avoid making any electrical contact with the peripheral part of the chip when the article is making electrical connections between the said pairs of connection sites.

The plating of the electrically conductive material in the through-holes is advantageous in this and other aspects of this invention in enabling finer conductors (e.g. in holes of not more than 200 micrometres, for example 5 to 150, preferably 10 to 100 micrometres, diameter, less than 100 micrometres being generally preferred) to be positioned more accurately and efficiently than may be possible with other techniques. Precision is especially important with the increasing miniaturisation of electronic devices, for example when at least some of the said through-holes in the said pattern are less than 100 micrometres apart from centre to centre, in which case the through-holes will of course be less than 100 micrometres in diameter. Subject to such limitations imposed by the dsired hole spacing, the through-holes in all aspects of the invention may for example be 1 to 200 micrometres in diameter, and it is also preferable in most cases that the conductive material project beyond both main surfaces of the sheet material, the projections from either surface preferably being, for example, 0.2 to 100 micrometres in height, preferably 0.5 to 30 micrometres, especially 2 to 25 micrometres.

The insulating sheet material in all aspects of the invention will preferably be a flexible polymeric material, although inorganics could be used.

The through-holes in all aspects of the invention will preferably have a tortuosity factor (mean path length/sheet thickness) less than 3, preferably less than 1.2, and will preferably have an aspect ratio (pore length/pore diameter) of at least 2.5.

Although the "electrically conductive" paths between the sheet surfaces may give the sheet an electrical conductivity in the thickness direction within the semiconductive range, it is preferable to achieve generally metallic levels of conductivity, e.g. at least 1000 Siemens per centimetre, preferably at least 5000 Siemens, especially at least 10000 Siemens per centimetre. The preferred conductive materials are metals, preferably plated, especially electrolessly plated, on the interior surface of the through-holes. Any suitably applicable metals may be used, for example Ni, Cu, Au, Co, Pd, Pd—Ni, Sn. Pb, Pb—Sn, In.

In preferred forms of the articles according to various aspects of this invention, at least a significant proportion (preferably all) of the through-holes individually contain a tubular formation of the electrically conductive material projecting beyond the sheet surface. The term "tubular" is not intended to imply any specific cross-sectional shape: the holes may be circular, eliptical, polygonal, or any other convenient shape, and may be tapered or straight-sided.

Various forms of the invention could be used to provide relatively precise and stable "posts" of solder or other fusible metal e.g. indium, which would fill and are supported by the tubular formation, for use in making soldered connections to microcircuits. Gold filling material could also be used to make such "permanent" electrical connections. The tubular metal lining of the through-holes facilitates introduction of the fusible metal which wets the metal lining more readily than it would wet the insulating sheet material.

Preferably, this tubular formation comprises a first portion of electrically conductive material on the hole surface, and a second portion of material, preferably electrically conductive material, on at least one of the end surfaces of the first portion, at least the parts of the second portion on one or both of the end surfaces of the first portion projecting beyond the sheet surface(s). Preferably, the first portion of electrically conductive material on the pore surface is tubular and the second portion of electrically conductive material is on the interior surface as well as the end surface(s) of the first portion. The first portion is preferably metal and is preferably plated, especially electrolessly plated, on the interior pore surface, and the second portion is preferably metal plated, especially electrolessly plated, on the first portion. The first and second portions respectively may comprise different electrically conductive materials, and the second portion may fill the tubular first portion or may itself be tubular, in which case it may be filled with further electrically conductive (or other) material. Where the metal-lined through-holes are filled with another metal this will preferably be a solder, a low-melting-point metal, fusible alloy, or plated metal. Either the tubular metal lining, or the metal fillings, or both may project beyond the sheet surface (s), and the other criteria mentioned above may apply as appropriate. A particularly preferred combination is a copper first portion, nickel second portion, and a gold third layer on the nickel, which gold may be tubular or may fill the tube of copper and nickel.

Preferably, electrically insulating material is removed from one or both surfaces of the sheet material to expose portions of the electrically conductive material originally within the through-holes, thus producing or increasing the desired projections of the conductive material beyond the sheet surface(s). This may be done by any convenient means, for example by dissolving away a surface layer of the sheet material, for which purpose a sheet having surface layers of materials more readily soluble in a selected solvent than the underlying layers may be used.

Any electrically insulating sheet material may be used in which the required pattern of through-holes can be formed with sufficient precision, preferred polymeric materials including those acceptable to the electronics industry, for examples epoxies, polyurethanes, polyimides, silicone rubbers, polysulphones and polycarbonates. The sheet may carry an adhesive layer on one or both of its surfaces if desired for its intended end use. A preferred laminar sheet of polyimide with surface layers of aromatic or amorphous polyamide is described in copending International Patent Application . . . (RK362COM), the disclosure of which is incorporated herein by reference. The preferred polyimide for this and other aspects of the present invention is one which is capable of retaining at least 50%, preferably at least 75%, more preferably at least 85%, of its original elongation after immersion in water of pH 10 at 100° C. for four days according to ATSM D882. It will be readily understood that a sufficiently fully cyclised polyimide having less than 15%, preferably less than 10%, more preferably less than 5%, and if possible, substantially no open imide rings or uncyclised amic acid groupings maybe better able to survive hot alkaline metal plating baths, which attack incompletely cyclised polyimides such as Kapton (TM). Preferred materials include polyimides derived from polymerisation of 4,4'-biphenyl dianhydride and (4,4'-diaminobiphenyl, or 4,4'-diaminobiphenylether or phenylenediamine). The polyimide of 4,4'-diamobiphenyl may provide thermal characteristics which are especially well suited to microcircuit applications. Corresponding polymers using the 4,3'- or 3,3'-isomers of the above three diamines and/or using pyromellitic dianhydride instead of the biphenyldianhydride (but excluding Kapton, of course) may also be useful. The currently more preferred commercially available polyimides are those available under the Trade Mark "UPILEX" from Ube/ICI. One of these, "UPILEX R", is believed to be a relatively completely cyclised polymer having a repeat unit derived from biphenyl dianhydride and diaminodiphenylether, viz.

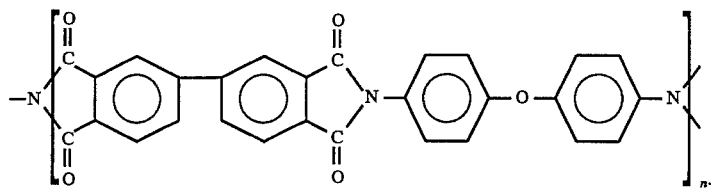

Most preferred, however, is "UPILEX S", which is believed to have a repeat unit derived from the same anhydride and p-phenylene diamine, viz.

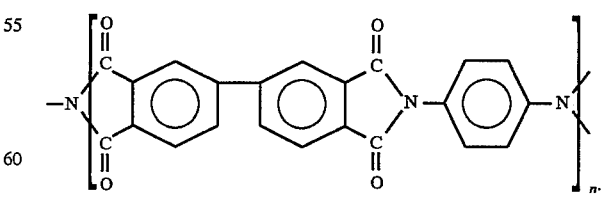

The invention includes methods of making the articles in question comprising:

(a) applying a first portion of electrically conductive material to the interior surface of the through-holes in the selected pattern on an appropriate electrically insulating sheet material, (b) removing any electrically conductive material from the opposed main surfaces of the surfaces of the sheet material, and (c) applying a second portion of the electrically conductive material to at least the end surfaces of the first portion, preferably to substantially all accessible surfaces on the first portion, and optionally applying a third portion to the second.

Sheet material with low tortuosity porous structure acceptable for producing the uniaxially electrically conductive articles according to the various aspects of the inventions may be produced by any convenient method. For example, any method that lends itself to piercing a suitable number of holes in dielectrics can be used. A non-exhaustive list of means to produce pierced sheets is given below:

1 Nuclear track etching: The polymeric sheet is exposed, through a mask corresponding to the desired pattern of through-holes, to high energy ion bombardment, either from a nuclear reactor or a high energy particle accelerator, and afterwards etched in a suitable solution. The damage tracks formed by the ions then show up as tubular through-holes in the sheet. Tubular through-holes with a hole diameter of 0.1 to 50 micrometres are easily drilled through 5 to 1000 micrometre sheets of e.g. polycarbonate or polyimide.

2 Laser drilling: The polymeric sheet is masked and subject to overall ablation of the exposed areas by laser light of low wavelength (350 to 150 nanometres). Any patterned screen limiting the laser light (e.g. a pierced metal screen) will give rise to the same pattern being reproduced on the polymeric sheet. Tubular through-holes greater than 5 micrometres in diameter can be produced by this method, and piercing through 0.5 millimetre thick layers is possible by extended exposure of e.g. epoxy, polyurethane, polymide, or polysulphide sheets. Alternatively, a focussed laser beam of any suitable wavelength could be used to drill individual holes.

Laser drilling, preferably by ablative photodecomposition using a U.V. excimer laser e.g. KrF (249 nm) or XeCl (308 nm), has the advantage of producing through-holes with less pronounced taper than alternative chemical etching methods, the lower degree of taper permitting closer pitch (closer hole-to-hole spacing). This is clearly advantageous, given that microcircuits are becoming progressively smaller and more densely patterned. Through-holes with taper (measured between the substantially straight inner surface of the hole and the axis of the hole) less than 10°, preferably less than 8°, more preferably less than 6°, and especially less than 4° can advantageously be achieved by laser drilling of suitable polymer sheets, and may usefully be incorporated in all aspects of the invention described herein.

III Punching: The polymeric sheet is placed in a press and metal spikes are forced through it. The method lends itself to any polymer not too brittle, e.g., poly sulphone or silicone rubber. Tubular holes 0.1 millimetre in diameter can be produced in 2 millimetre thick sheets by this method.

Preferred methods of making the articles in question from an insulating sheet material having the desired pattern of through-holes, produced by e.g., one of the above mentioned methods, may comprise, by ways of example, the following steps:

a Rendering the polymeric sheet suitable for electroless plating by conditioning the surface of the sheet and holes with a catalyst.

b Coating the entire sheet and the interior of the holes with a thin metal layer by electroless plating.

c Removing the catalyst (and the thin metal layer if present) from the sheet surface.

d Electrolessly plating to produce a thicker metal layer in the tubes and to create small projections from the through-holes.

e Polishing smooth the ends of the tubes.

f Optionally:

Electro or electroless plating in the through-holes to fill the through-holes partially or completely with metal; or Embedding solder or any fusible low melting metal inside the metal lined through-holes by, e.g., wave-soldering or capillary absorption or any other suitable method; or Introducing a non-metal into the metal lined through-holes, for example a flux or an adhesive; or Removing electrically insulating material (e.g. a laminate layer) from one or both main surfaces of the sheet material so as to expose portions of the electrically conductive material originally within the through-holes.

When the through-holes are to be filled with molten metal, e.g. solder, it is preferred that the tubular metal layer within the through-holes be of sufficient thickness, e.g. at least 0.5, preferably 1.0, more preferably at least 3 micrometres, to avoid being completely removed by the pore filling operation.

The aforementioned removal of any electrically conductive material from the sheet surface before application of the second portion of conductive material may be effected by any convenient means. When, as is preferred, a very thin "sheen" or "flash" coating of metal is plated onto the sheet material, this may be removed from the surface by chemical etching or by a simple friction, e.g. wiping, leaving the metal only in the through-holes to act as a catalyst or base for commencement of the second application. The hole diameter is preferably adjusted to the device contact pad size (at least down to 25 micrometre square), although smaller holes may be used allowing for redundancy if the connection between pad and metal projection is broken either by bad production of the metal-plated through-holes or unfortunate mounting or due to thermal or mechanical shocks.

The sheets with the patterns of through-holes may be made of high performance polymers able to withstand severe mechanical handling and high temperatures, and may be transparent or translucent. When this is the case the sheets are easy to handle. The transparency or translucency allows for automatic mounting procedures which use light shone through the sheet.

A single conductive through-hole may be provided for each pair of facing connection sites, in which case the diameter of the through-holes is preferably selected to suit the size of the connection sites, or groups of two or more smaller conductive through-holes may be provided to make multiple simultaneous connections between connection sites in each pair.

Examples of this aspect of the invention will now be described with a reference to the accompanying drawings, wherein:

FIG. 1 shows schematically an assembly of a uniaxially conductive article according to the invention between facing sets of connection sites carried on two substrates;

Figure 2A:
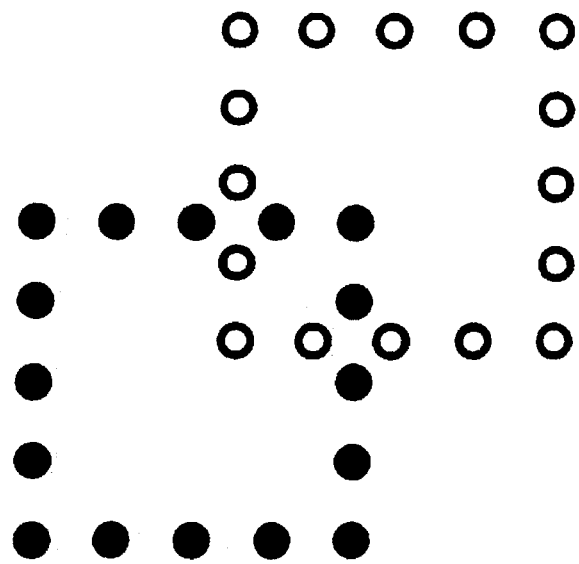
FIGS. 2a and 2b show schematically overlapping patterns of through-holes any one of which may be aligned with the patterns of connection sites on an appropriate substrate.

Referring to the drawings, FIG. 1 shows schematically an arrangement including a microchip 10 having connector pads 11 on its lower (as illustrated) surface, the pads being shown in the inset plan view of the chip 10. The chip 10 is connected to a fan-out circuit board 30, which has contact pads 31 and conductive tracks 32 of known kind for connecting the chip to other test circuitry.

The connection between chip 10 and circuit board 30 is made by uniaxially electrically conductive sheet 40 of the kind hereinbefore described having tubular metal projections 41 in through-holes arranged to correspond with the contact pads of the chip 10 and circuit board 30. Contact between the ends of the metal projections 41 and the respective pads 11 and 31 temporarily or permanently connects the pads 11 of chip 10 to the corresponding pads 31 of the board 30.

Figure 2B:
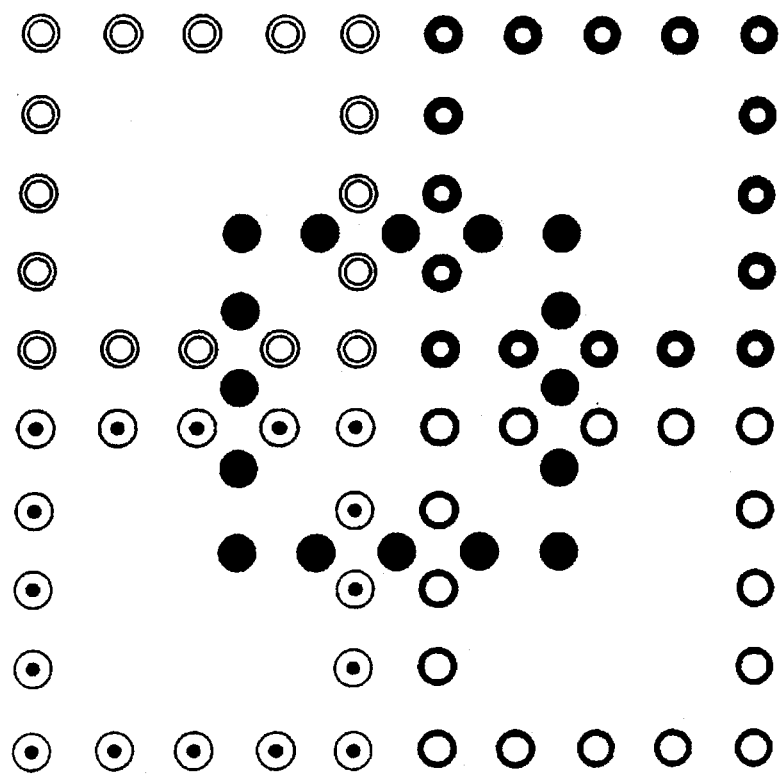

FIG. 2a shows one possible pattern for two sets of metal projections 41 to be provided in overlapping arrangement to save space on the sheet substrate of the uniaxially conductive article 40, while FIG. 2b shows a possible pattern of five such overlapping sets of projections. Any one of the five sets of projections can be aligned with the connection pads of the chip 10 and board 30 by suitably positioning a sheet 40 having such overlapping patterns. In addition to the space saving, such overlapping patterns may be drilled using fewer "shots" or pulses of the laser in the preferred laser drilling methods, thus significantly extending the working life of the laser.

Chip Testing

Articles according to this invention may be used in an electrical device or assembly process in which one or more temporary or permanent electrical connections are made by contact with the opposite ends of the electrically conductive material located in the through-holes. Testing of microcircuits before or during assembly into electronic devices may especially benefit from fast, reliable temporary connections between microchip connector pads and the contact pads of a suitable circuit board. Unacceptable chips can thus be rejected before any expensive bonding or packaging operations.

This aspect of the invention provides a new method of testing an electronic microcircuit chip comprising
(a) aligning connection sites on the microcircuit chip face-to-face with corresponding connection sites on a test circuit chip,
(b) positioning between the facing chips a uniaxially electrically conductive article comprimising electrically insulating sheet material with at least one through-hole aligned between each pair of facing connection sites, the through-holes containing electrically conductive material which provides an electrically conductive path between, and projects beyond, the main surfaces of the material, and
(c) bringing the respective pairs of connection sites into contact with the electrically conducitve material in the through-holes respectively aligned herewith, thereby temporarily electrically connecting the connection site of the chip to be tested to the connection sites of the test circuit chip.

This "mirror chip" test method has several advantages over known chip testing methods. For example, chips are normally tested at the wafer stage using "probe cards". These are arrays of fine metal probes which are brought into contact with the contact pads on a chip (one probe per pad, so each probe card is specific to the chip design). A computer drives signals through the probes, and so tests the chip. Probe cards have several disadvantages:
* the probes damage the pads to the extent that chips can only be probed once;
* probe cards for chips with many pads are very expensive to build;
* high frequency testing using probe cards is difficult because the probes constitute an antenna with uncontrolled impedance, thus causing crosstalk and signal distortion;
* when used for complex chips with many contact pads they are difficult to align, and must be regularly maintained to keep in alignment.
* probe cards are complex and difficult to make for testing chips which have contact pads at other than the periphery.

The uniaxially conductive article according to this invention has no fragile unsupported pins to become misaligned, and the article can be thrown away if it becomes damaged, since it is relatively inexpensive to replace.

A further advantage is that the uniaxially conductive article can be relatively thin, allowing the chip under test to be brought much closer to the test circuitry e.g. to within 50–1000 micrometres or less. This means that the crosstalk and signal distortion is minimised, which is especially advantageous in high speed and/or high frequency chips.

The "mirror chip", that is one with a set of pads that mirror those on the chip under test, is connected to the bulk of the test equipment by other pads, probably around the edge of the mirror chip.

The electrical function of the "mirror chip" would of course depend on the nature of the chip under test. The mirror chip could provide power and ground connections, and output test patterns of digital data, or measure analogue parameters such as capacitance. It may contain A/D converters or filters, or may simply be "transparent", that is it may pass on undistorted waveforms from the main test equipment. Its function is to output test patterns and gather undistorted information from the chip under test.

The preferred forms of uniaxially electrically conductive article for this and subsequent aspects of the present invention are those supplied by Raychem Limited, for example as described in the aforementioned EP-A-0213774 or as described earlier in the present application or as desribed in copending International Application PCTGB89 . . . (RK361COM) incorporated herein by reference. For convenience, the description of the present invention hereinafter will refer to iniaxially conductive sheets, it being understood, however, that the invention is not limited to the use of those specific preferred sheet forms of uniaxially electrically conductive article.

For the "mirror chip" testing method of the present invention now being described, the uniaxial sheet may be constructed with only one through-hole containing the electrically conductive material between each pair of facing connection sites, in which case the size of the through-holes will preferably be chosen to suit the size of the connection sites. Alternatively, there may by two or more smaller through-holes independently containing the electrically conductive material between each pair of connection sites. In either case, the sheet may have substantially no other conductive through-holes, thus providing a single "one-to-one" pattern of conductive paths (one path or one group of paths for each pair of connection sites) as hereinbefore described; or the sheet may have two or more such "one-to-one" patterns interspersed with each other for selective use as also hereinbefore described; or the same sheet may have a multitude of conductive through-holes as described in the aforementiond EP-A-0213774 for random alignment between the facing pairs of connection sites; always provided that any conductive through-holes not acting between the facing pairs of connection sites do not interfere unacceptably with the chip testing process.

Thermal Control

Modern semiconductor integrated circuits dissipate a lot of power as heat, yet are unable to withstand high temperatures themselves. To remove this heat, chips are joined to heat sinks with solder or metal-loaded adhesives. Both these methods are prone to irregularities, leading to temperature stresses within chips. This can destroy clock synchronisation in high speed devices.

A uniaxial sheet can be used according to this aspect of the invention as as uniform, compliant thermally-conducting interface. Copper tubes are good thermal conductors, and they can either be permanently bonded to a metal layer on the back of a chip, compression joined to the back face, or remove heat from the front face of a chip that is also electrically connected by the uniaxial sheet.

Thus, a third application according to this invention provides an assembly comprising a microcircuit chip and a heat sink respectively bonded to opposite faces of a substantially uniaxially heat-conductive article comprising relatively insulating sheet material having at least 25 through-holes per square millimetre of its surface, which through-holes individually contain metal which provides a relatively conductive path between the main surfaces of the sheet material and is in thermal conductive contact with the chip and the heat-sink. The metal may be in the holes in the form of a tube or may completely fill the through-holes In one form of this assembly, the metal contained in the through-holes is in contact with the heat-sink and the back of the chip. In another form, the metal contained in the through-holes is in contact with the heat-sink and the front of the chip. In suitable assemblies, it is possible that the metal in some of the through-holes electrically connects electrical connection sites on the chip to electrical connection sites of other circuitry. The uniaxial sheet is preferably of the aforementioned kind having a multitude of conductive through-holes, preferably having metal plated in the through-holes. The metal preferably projects beyond the main surfaces of the sheet material.

CONFINED CONDUCTIVE AREA

A fourth application according to this invention provides a uniaxially electrical conductive article for use in face-to-face contact with a microcircuit chip which chip has an electrically uninsulated and conductive edge region on one of its main surfaces, the article comprising electrically insulating sheet material which has at least 25 through-holes per square millimetre of its surface, at least a significant proportion of which through-holes individually contain electrically conductive material which provides an electrically conductive path between the main surfaces of the sheet material, and the holes containing the electrically conductive material being confined to areas of the sheet material which in use can be arranged to contact the surface of the chip having the said conductive edge region without overlying that region.

In this case, the uniaxially heat-conductive article is preferably a uniaxial sheet of the aforementioned kind having a multitude of conductive through-holes, preferably having metal plated in the through-holes. The metal preferably projects beyond the main surfaces of the sheet material.

Appropriate forms of uniaxially conductive sheet for the various embodiments of the present invention may be made, for example, by the methods and materials hereinbefore described, or those described in the aforementioned EP-A-0213774 or copending international application PCTGB89 . . . (RK361COM), PCTGB . . . (RK362COM), or PCTGB89 . . . (RK363COM), the respective disclosures of which are incorporated herein by reference.

The diameter and distribution of the through-holes in some aspects of the invention may be such that the through-holes occupy from 3 to 35 percent, more preferably 10 to 20 percent, of the sheet surface area. Through-holes of less than 500, preferably less than 200, e.g. 5 to 150, micrometres diameter are desirable. A sheet with at least 25 through-holes per square millimetre having plated electrically conductive material (metal) within (preferably substantially only within) the through-holes is especially useful, the through-holes thus providing high density electrically conductive paths between the sheet surfaces, each such path being electrically separate from substantially all the other such paths.

While a "significant proportion" of the through-holes in the selected areas, for example at least 10%, preferably at least 20%, more preferably at least 30% or better still at least 40%, may contain the conductive material, it is preferred that a majority (more than 50%) do so. Proportions of at least 70%, or better still at least 85% are preferred, and in many cases, substantially all of the through-holes will contain the conductive material. The through-holes, whether containing the conductive material or not, may be confined to selected areas of the sheet.

The insulating sheet material will preferably be a flexible polymeric material, and the number of through-holes per square millimetre of the sheet material (whether flexible polymeric or not) may be as high as 10000, but will preferably be less than 5000, e.g. in the range from 25 to 2000, more preferably 50 to 1000.

In some forms of the articles, at least a selected portion of the sheet has a plurality (at least 4, preferably at least 8, more preferably 25 to 1000) of substantially non-interconnected through-holes per square millimetre of its surface, at least a significant proportion of which through-holes individually contain a tubular formation of electrically conductive material projecting beyond at least one of the sheet surfaces.

The invention also provides a strip of electrically insulating material carrying two or more arrays of the through-holes containing electrically conductive material as hereinbefore described, the strip preferably being adapted for feeding to suitable processing equipment (e.g. for chip testing, permanent bonding, or heat-sink applications as hereinbefore described) by mechanical, preferably automatic, feed means.

Figure 6:
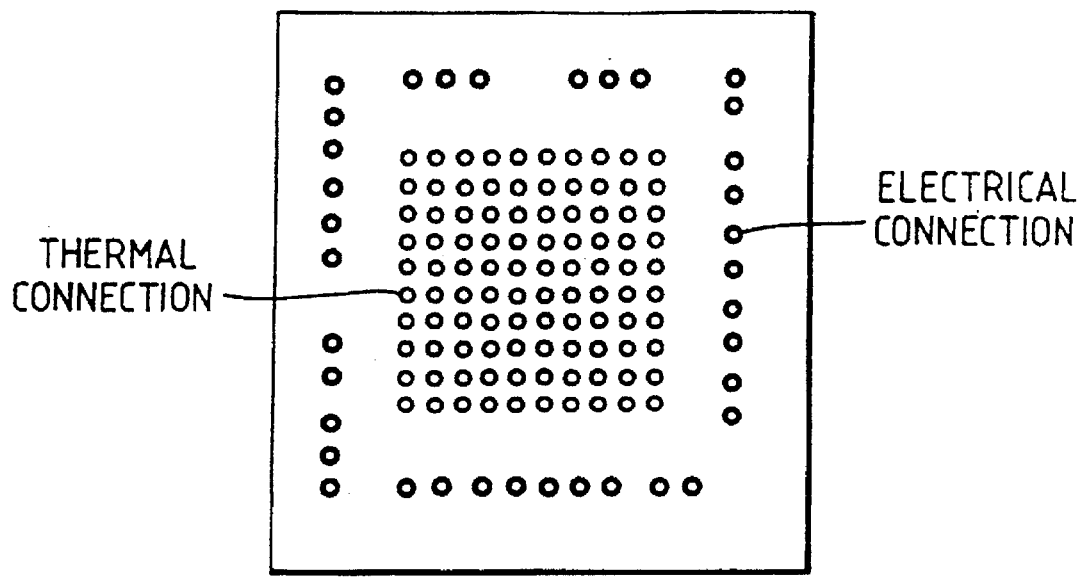
Figure 7:
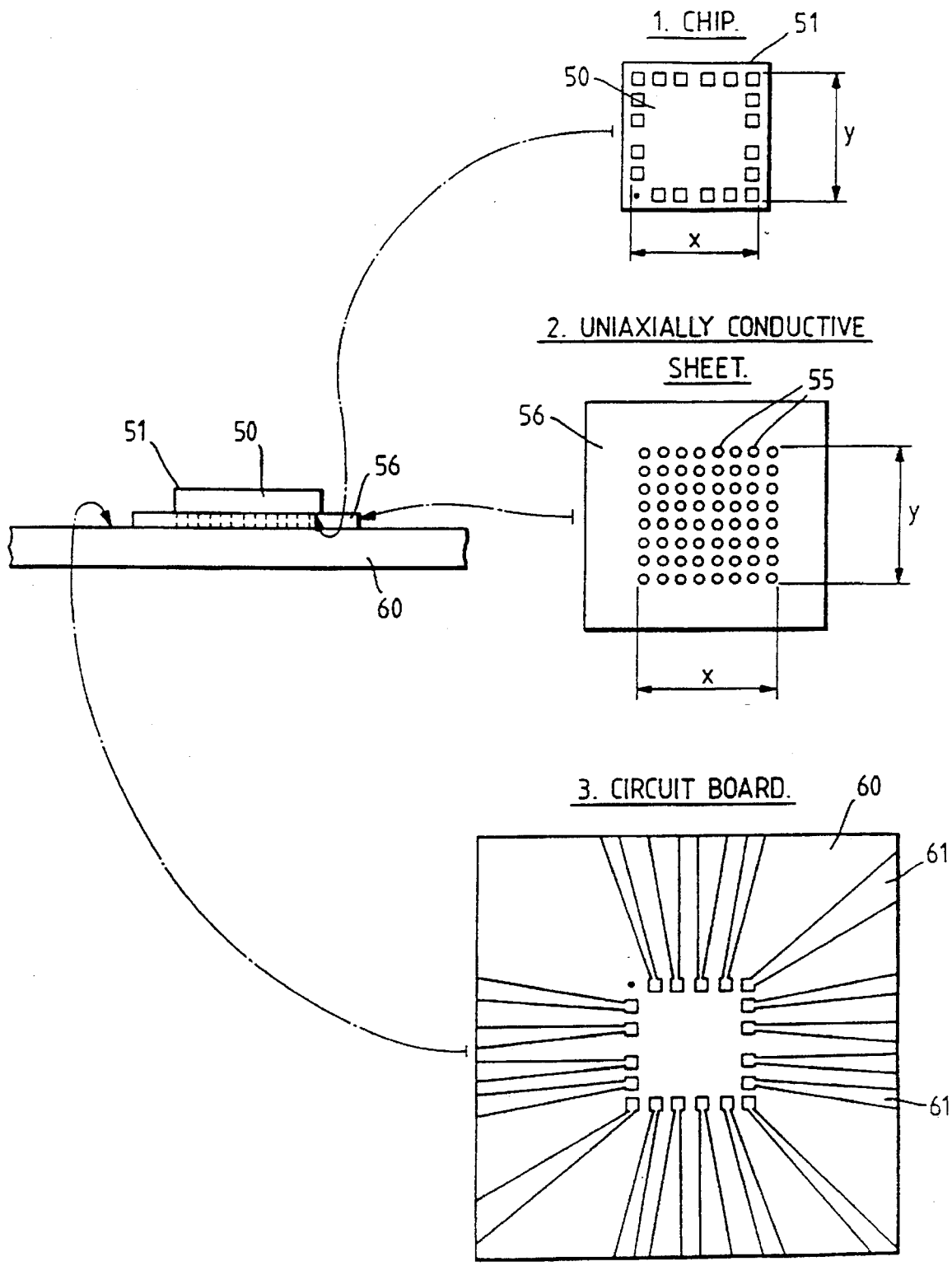

Examples of these various aspects of the invention will now be described with reference to the accompanying drawings, wherein:

FIG. 3 shows schematically an arrangement for testing integrated circuit semiconductor chips by means of a uniaxially conductive sheet and a "mirror chip" test circuit;

FIG. 4 shows schematically the use of a uniaxially conductive sheet to connect the back of a chip to a heat-sink for thermal control;

FIG. 5 shows schematically the use of a uniaxially conductive sheet to connect the front of a chip to a heat-sink for thermal control, possibly together with other connections of the front of the chip to electrical circuitry;

FIG. 6 shows schematically a feasible form of uniaxially conductive sheet for the thermal and electrical connections of FIG. 5;

FIG. 7 shows schematically one arrangement for ensuring that a uniaxially conductive sheet avoids unwanted electrical connections with a conductive edge region of the chip resulting from cleavage of the chip from a surface-passivated array of such chips; and FIG. 8 shows schematically an alternative arrangement for avoiding unwanted electrical contacts using a surface-passivated circuit board.

Referring to the drawings, in FIG. 3, the chip 10 to be tested has connection pads 11 facing downwards (as illustrated) towards a uniaxially electrically conductive sheet 15 having plated metal tubes 16 positioned in and protruding from an array of through-holes positioned to correspond with the connection pads 11. The sheet 15 is made by the methods hereinbefore described. A substrate 20 carries the "mirror chip" 21 with the connection sites 22 corresponding to the metal tubes 16. The chip 10 to be tested may thus be temporarily connected to the "mirror chip" 21 by gently compressing the sheet 15 between the chip 10 and the "mirror chip" 21 which contains test circuitry and is in turn connected to further circuitry (not shown) to apply the desired electrical tests. Several different digital and analogue chips may be tested in this way, for example an operational amplifier, and an octal latch, and at high frequencies crosstalk and signal distortion tend to be reduced by the close spacing of the chip and the test circuitry, as aforementioned.

Examination of the chips with optical and electron microscopes after testing by contact with a uniaxially conductive article of the kind described showed that the damage caused to the chip connection sites was very much less than that produced by testing with a conventional probe card.

In FIG. 4, a chip 30 is shown face-up with its bonding sites 31 wire bonded to the bonding sites 45 of an associated circuit board 46 by gold wires 47. A heat-sink 40 is provided to conduct away heat generated by the chip in operation, and this is thermally connected to the back of the chip 30 by contact with the projecting metal tubes 35 of a uniaxially conductive sheet 36 of the kind generally described hereinbefore. Although a regular array of metal tubes 35 is indicated in this schematic drawing, non-symetrical and/or irregular spacing of the tubes may also be used to control the pattern of heat dissipation as required. For example, greater concentration of the metal tubes could be provided to connect to a particularly hot area of a given chip.

FIG. 5 shows an alternative heat-sink arrangement, in which chip 30 is bonded face-down not only to the heat-sink 40, but also to connection sites 45 of the substrate 46. For this purpose, the uniaxially conductive sheet 36 has metal-plated through-holes 35 aligned between the bonding sites 31 of the chip 30 and the bonding sites 45 of the substrate 46 in addition to the plated holes which connect the passivated areas of the chip 30 to the heat-sink 40. One pattern of through-holes for this purpose is illustrated in FIG. 6.

FIG. 7 illustrates the connection of a chip 50 to a circuit-board 60, where the chip has an unpassivated edge region 51 resulting from cleaving of the chip from a wafer of such chips in known manner. In this arrangement, the multitude of metal-plated through-holes 55 of a uniaxially conductive sheet 56 made by the aforementioned methods is confined to an area XY which is arranged to avoid contact of the projecting metal tubes with the electrically conductive chip edge 51. In this way, undesired short-circuits between the conductive tracks 61 on substrate 60 are avoided.

FIG. 8 shows an alternative to the arrangement of FIG. 7, in which the multitude of plated holes no longer needs to be confined to area XY as a passivating surface 62 is provided on the substrate 60 which overlies and passivates all of the conductive tracks except within the area corresponding to area XY of the chip.

Overplating

Figure 9:
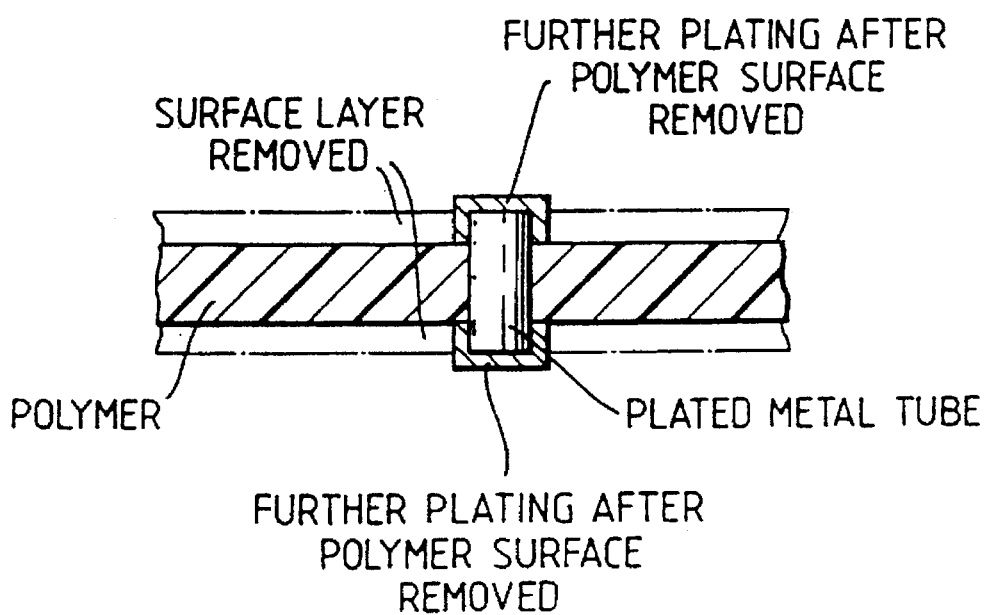

FIG. 9 illustrates another inventive aspect in the application of a further layer of metal, e.g. gold plating, after removal of one or more surface layers of a polymer to produce projecting metal conductors in the holes of the uniaxially conductive articles. The further plating acts as a collar to help retain the projecting metal, (e.g. plated tubes) in the holes. In addition to this preferred method of anchoring the metal conductors, the invention includes the resulting uniaxially electrically conductive article, comprising electrically insulating sheet material with through-holes individually containing the electrically conductive material with overplated projecting ends.

Metal Columns

Figure 10:
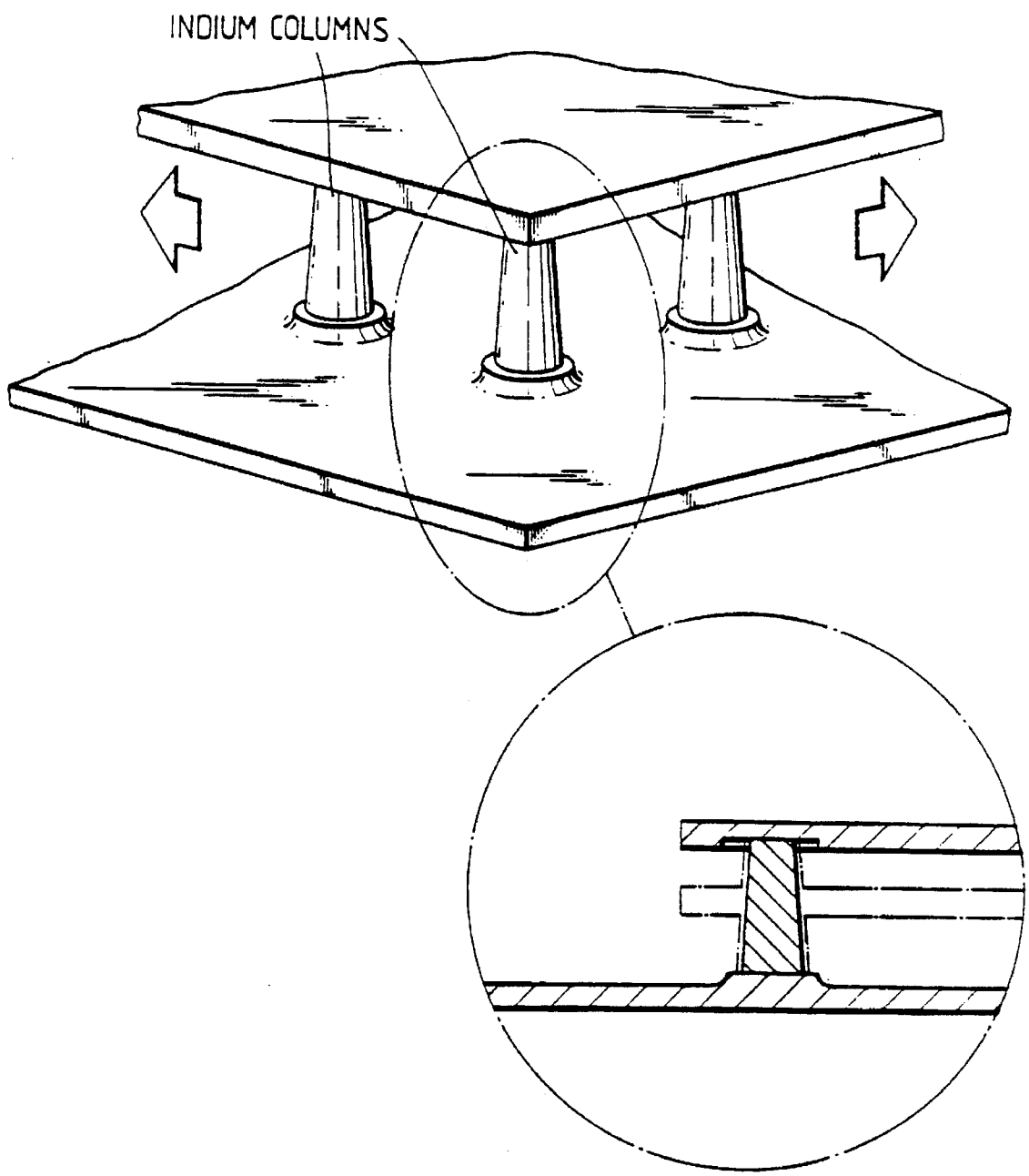

FIG. 10 illustrates connections made by columns of fusible metal, solders or alloys, e.g. lead/tin, lead/tin/silver, gold/tin, lead/indium, indium, tin presented in a uniaxially conductive article from which the polymeric carrier sheet (dotted lines in inset) has been removed, e.g. by a suitable solvent after bonding of the columns. Such metal columns could be used in devices embodying various aspects of the present invention, and may be especially useful in high-density arrays of interconnections, for example a closely-packed array of "1:1" interconnections, having one such column for each pair of opposed bonding sites. The columns are made, for example, by filling the initial plated metal tubes with molten metal, and allowing the molten metal to solidify. The filling metal may be the same as or different from the plating metal.

Another aspect of the present invention relates to a suprising variation of the known design which overcomes certain technical problems as explained below.

Recessed Conductive Paths

This aspect of the invention provides an anisotropically electrically conductive article comprising electrically insulating sheet material having through-holes therein containing electrically conductive material, which conductive material within at least some of the through-holes is recessed below the level of at least one of the main sheet surfaces in the sense that it ends sufficiently below the surface to avoid making electrical contact with an electrically conductive member when a surface of that member which is wider than the relevant through-hole is brought into contact with the said one of the main sheet surfaces so as to lie across that through-hole.

When electrical contact can be overcome by causing flowable electrically conductive material to enter the through-holes to establish contact where desired, while the recessed material elsewhere on the sheet advantageously avoids undesirable electrical contacts, for example with the conductive edges of a microchip cleaved from a semiconductor wafer. The flowable material may for example be solder bumps of known kind on the connection sites of such a chip.

The recessed conductive material may also be useful for making temporary electrical contact with contact sites projecting from a microcircuit, e.g. a "bumped" chip, the projections being capable of entering the through-holes to contact the recessed conductive material. In such cases, the use of a deformable or resilient sheet material may advantageously compensate for surface irregularities in the chip or other substrate pressed against the anisotropically conductive article according to this aspect of the invention.

For some purposes it may be preferable that the recessed article is substantially uniaxially conductive for the reasons indicated under the foregoing heading "1:1 CONNECTION". The alternative uniaxial construction having a multitude of holes, as in the aforesaid European Application 0213774 may also be used with appropriate recessing of the conductive material.

The electrically conductive material may be introduced into the through-holes by any convenient technique, preferably by plating, and the necessary recessing may either arise as a result of the introduction process, or may be effected subsequently, for example by grinding and/or etching away conductive material initially extending to or beyond the sheet surface(s). Recessing below both sheet surfaces is included in the invention. The depth of recessing may be selected to suit the end use of the article, a depth of at least 10, preferably 10 to 15, micrometres being preferred for chip connections.

After electrical connections have been made by causing electrically conductive material to flow into contact with the recessed material in the holes, electrically insulating material may be removed from one or both surfaces of the sheet material to expose portions of the electrically conductive material originally within the through-holes. Such exposure could be effected at one surface before bonding if projection of the conductive material beyond that sheet surface is desired. Removal may be effected by any convenient means, for example by dissolving away a surface layer of the sheet material, for which purpose a sheet having surface layers of materials more readily soluble in a selected solvent than the underlying layers may be used.

Articles according to this aspect of the invention may be used in an electrical device or assembly process in which one or more temporary or permanent electrical connections are made by causing flowable electrically conductive material to flow and establish contact between the recessed electrically conductive material located in the through-holes and an external connection site. The flowable material may flow from the external site into the holes and/or may be initially within the holes and flow out to establish the contact. Localised or focussed heating could be used to melt fusible material only within selected through-holes or sheet areas.

Figure 11:
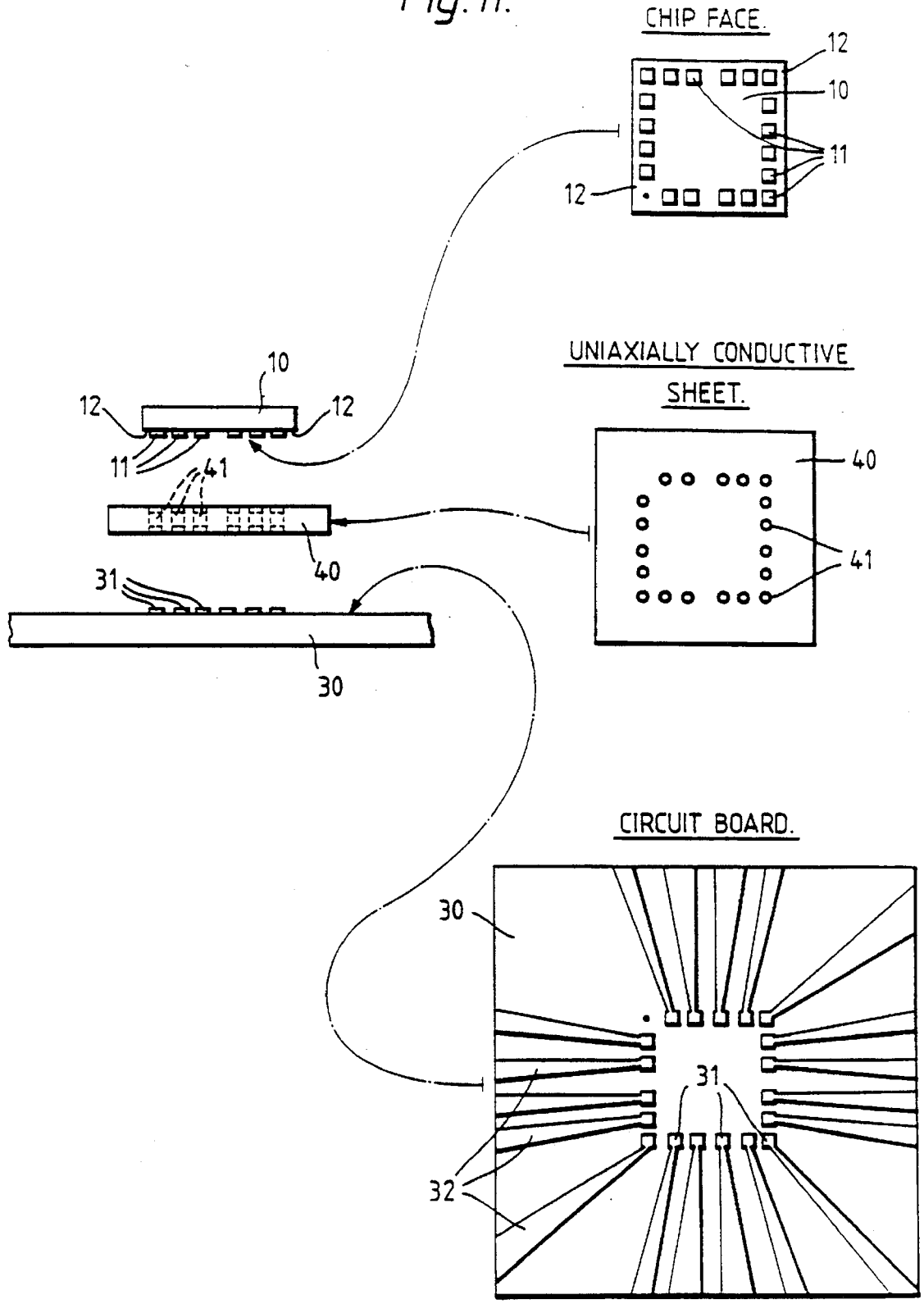
Figure 12:
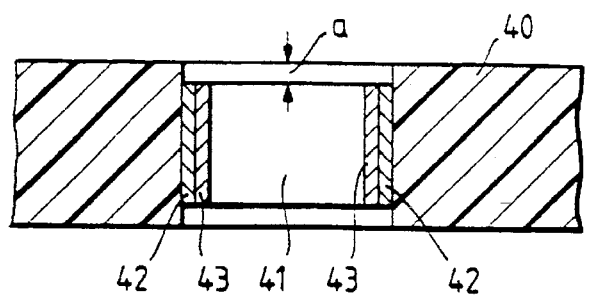
Figure 13:
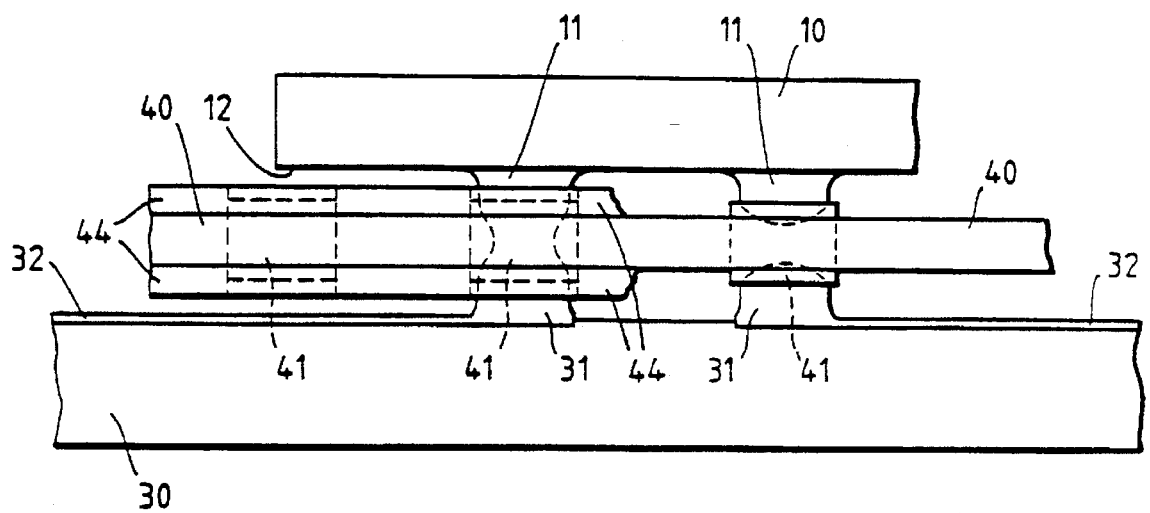
Figure 14:
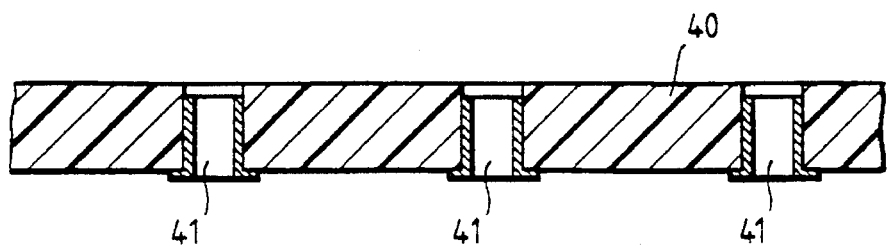

Examples of this aspect of the invention will now be described with references to the accompanying drawings, wherein:

FIG. 11 shows schematically an assembly of a recessed uniaxially conductive sheet between facing sets of connection sites carried respectively on an integrated circuit microchip and a fan-out circuit-board;

FIG. 12 shows schematically in section one of the metal-plated through-holes in the uniaxially conductive sheet;

FIG. 13 shows schematically an enlarged view of part of the assembly after bonding of the connection sites to the uniaxially conductive sheet; and FIG. 14 shows an alternative preferred form of the uniaxially conductive sheet.

Referring to the drawings, FIG. 11 shows schematically an arrangement including a microchip 10 having solder-bumped connector pads 11 on its lower (as illustrated) surface, the pads being shown in the inset plan view of the chip 10, and has conductive edge regions 12 resulting from cleaving a wafer of such chips. The chip 10 is connected to a fan-out circuit board 30, which has solder-bumped contact pads 31 and conductive tracks 32 of known kind for connecting the chip 10 to other test circuitry.

The connection between chip 10 and circuit board 30 is made by a uniaxially electrically conductive sheet 40 having tubular formations of plated metal 41 recessed in through-holes arranged to communicate between the contact pads of the chip 10 and circuit board 30. Contact between the recessed ends of the metal 41 and the respective pads 11 and 31 electrically connects the pads 11 of chip 10 to the corresponding pads 31 of the board 30.

The uniaxially conductive article may be of the "1:1" kind hereinbefore described having one through-hole or group of through-holes for each opposed pair of contact pads, or may have a more closely packed array of through-holes as described in the aforementioned EP0213774, the disclosure of which is incorporated herein by reference, provided that at least some of the conductors are recessed within the holes on at least one surfaces, instead of projecting from holes.

FIG. 12 shows schematically one of the 100 micrometre diameter through-holes produced by laser ablation of a polyimide sheet 40 having a metal conductor 41 formed in two layers 42, 43 by electroless plating as hereinbefore described. The conductor 41 is recessed below the sheet surface to distance "a" of 10 to 15 micrometres, and may be filled with flowable material such as solder (not shown).

FIG. 13 shows schematically part of the bonded assembly comprising for purposes of illustration three through-holes in polyimide sheet 40 with plated metal conductors 41. The through-hole illustrated at the left of FIG. 3 shows how the recessing of the metal conductors 41 avoids undesired electrical contact between the conductive edge region 12 of chip 10 and conductive track 32 of fan-out board 30. Of course the chip 10 and board 30 may be in close contact with uniaxially conductive sheet 40, the illustrated slight spacing being for purposes of schematic clarity.

The next illustrative through-hole to the right in FIG. 13 shows the solder-bumped bonding pads 11 of chip 10 and 31 of board 30 after fusion of the solder (by known methods) has caused it to flow into contact with the recessed metal 41 in the through-hole, thus electrically the chip pad 11 to the corresponding fan-out pad 31 and track 32.

The through-hole furthest to the right of FIG. 13 illustrates a similar connection between a chip pad 11 and board pad 31 after removal of soluble surface layers 44 from the polyimide sheet 40. The removal of the surface layers exposes more of the connecting metallic "leg" between the respective pads, which may have benefits in terms of thermal or physical performance of the connection, for example increasing its tolerance to differential thermal expansion of the components.

The solder may simply contact the ends of the tubular plated metal 41 as shown by the broken lines in the right-hand through-hole of FIG. 13, or may establish continuous metal contact through the plated tube 41 as shown in the middle hole of FIG. 13, either by solder from the pads meeting from the opposite ends, or by virtue of additional solder or other metal being previously present within the plated tube 41.

The preferred form of the uniaxially conductive article shown in FIG. 14 has the metal 41 recessed below one surface (upper as shown) but projecting beyond the other (lower) surface. This structure permits known techniques such as thermocompression or thermosonic bonding to be used on the projecting ends of the metal, while the flow techniques hereinbefore described are applicable to the other, recessed ends. The structure also has the advantage that the connections to the projecting ends can conveniently be made demountable or temporary, thus allowing testing of "flip chips", for example, which have been permanently bonded to the recessed ends. Faulty chips can then be discarded together with the attached conductive sheet, without loss of expensive chip supports or packages.

It will be understood that this invention generally has the advantage that the through-holes may reduce the tendency for sideways flow of solder bumps during bonding, thus permitting closer spacing of the connection sites. It also produces a greater standoff space between chip and substrate than ordinary "flip chip" bonding can achieve for a given size of connection site, thus helping to reduce the well-known problems arising form differential thermal expansion/contraction between chip and substrate.

Methods of preparing a recessed uniaxially conductive article for the present purposes will now be described by way of example:

EXAMPLE 1

An array of 35 micro-metre diameter holes were laser drilled in a sheet of polyimide laminated on both main surfaces with polyamide and were then through hole plated with electroless copper by methods hereinbefore indicated. A solution suitable for controlled etching of the copper was prepared, comprising silver sulphate in water in a concentration of 1 g per litre. This produced a slow etch rate solution which had a limited capacity for copper dissolution. The sample was immersed in the solution for a suitable length of time so as to remove any surface copper and to penetrate the copper plated through-holes, etching the copper beneath the surface level of the polyimide. The sample was rinsed, residual silver deposits removed, and the recessed copper plated further with thin layers of nickel and gold. The final product had the holes plated with tubular deposits of copper, nickel, and gold, with the tubes recessed 10 to 15 micro-metres below the sheet surface.

EXAMPLE 2

Example 1 was repeated except that the etching solution was applied to only one surface of the laminate leaving the plated tubes substantially flush with the other surface. The polyamide layer was subsequently dissolved away from that other surface to leave the plated tubes recessed below the one surface and projecting from the other.

EXAMPLE 3

Example 2 was repeated except that the etching solution was applied to both sheet surfaces, after etch resist material had been applied to one surface so that the metal tubes were recessed only at the other surface. The resist and the polyamide were subsequently removed from the non-recessed surface.

We claim:

1. A uniaxially electrically conductive article comprising electrically insulating sheet material with through-holes individually containing electrically conductive material with overplated ends each acting as a collar to help retain the conductive material in the holes, and each such hole providing an electrically conductive path between the main surfaces of the sheet material.

2. An article according to claim 1, wherein the conductive material in at least some of the said through-holes comprises a first portion of electrically conductive material in contact with the interior hole surface, and a second portion of electrically conductive material on at least one of the end surfaces of the first portion, at least the second portion projecting beyond the sheet surfaces.

3. An article according to claim 1, wherein electrically insulating material has been removed from at least one of the main surfaces of the sheet material to expose portions of the electrically conductive material originally within the through-holes, prior to overplating of the ends.

4. An article according to claim 1, having metal plated in the said through-holes.

5. An article according to claim 1, wherein at least some of the through-holes are not more than 200 micrometers in diameter.

6. An article according to claim 5, wherein at least some of the said through-holes are less than 100 micrometers diameter.

7. An article according to claim 1, wherein at least a significant proportion of the through-holes contain a tubular formation of the electrically conductive material.

8. An article according to claim 5, wherein the through-holes are 5 to 150 micrometers in diameter.

9. An article according to claim 8, wherein through-holes are 10 to 100 micrometers in diamter.

10. An article according to claim 7, wherein the conductive material in at least some of the said through-holes comprises a tubular first portion of electrically conductive material in contact with the hole interior surface, and a second portion of material in contact with the surface of the tube provided by the first portion.

11. An article according to claim 10, wherein the second portion of material is also tubular.

12. An article according to claim 10, wherein electrically conductive material of the said second portion is different from the electrically conductive material of the said first portion.

13. An article according to claim 7, wherein electrically conductive material, fusible alloy is within the tube provided by the tubular electrically conductive material.

14. An article according to claim 1, wherein the said through-holes have a tortuosity less than 3, preferably less than 1.2.

15. An article according to claim 1, wherein the electrically insulating sheet material is capable of retaining at least 50%, preferably at least 75%, more preferably at least 85%, of its original elongation after immersion in water of pH 10 at 100° C. for 4 days according to ASTM D882.

16. An article according to claim 1, wherein the electrically insulating sheet material is a polyimide derived from polymerisation of 4,4'-biphenyl dianhydride and 4,4-diaminobiphenyl.

17. An article according to claim 1, wherein the said through-holes have been made by laser drilling, preferably by U.V. laser ablation.

18. An article according to claim 1, wherein the said through-holes have a taper (relative to the hole axis) of less than 10%, preferably less than 8°.

19. An article according to claim 18, wherein the taper is less than 6°, preferably less than 4°.

20. An article comprising a strip of electrically insulating sheet material carrying two or more arrays of the through-holes containing electrically conductive material as specified in claim 1, the arrays being spaced from one another along the strip.

21. An article according to claim 1, wherein the electrically insulating sheet material is a polyimide derived from polymerisation of 4,4'-biphenyl dianhydride and 4,4'-diaminobiphenylether.

22. An article according to claim 1, wherein the electrically insulating sheet material is a polyimide derived from polymerisation of 4,4'-biphenyl dianhydride and phenylenediamine.

* * * * *

UNITED STATES PATENT AND TRADEMARK OFFICE
CERTIFICATE OF CORRECTION

PATENT NO. : 5,637,925
DATED : June 10, 1997
INVENTOR(S) : Ludden, et. al.

It is certified that error appears in the above-identified patent and that said Letters Patent is hereby corrected as shown below:

Title page, item [73], Assignee: insert--Raychem Limited, Swindon, United Kingdom--.

Title page, before item [57] add--Attorney, Agent, or Firm: Herbert G. Burkard and Sheri M. Novack.

Signed and Sealed this

Thirteenth Day of January, 1998

Attest:

BRUCE LEHMAN

*Attesting Officer*     *Commissioner of Patents and Trademarks*